United States Patent
Yoon

(10) Patent No.: US 6,785,168 B2
(45) Date of Patent: Aug. 31, 2004

(54) SEMICONDUCTOR MEMORY DEVICE HAVING ADVANCED PREFETCH BLOCK

(75) Inventor: Young-Jin Yoon, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/625,122

(22) Filed: Jul. 22, 2003

(65) Prior Publication Data

US 2004/0125659 A1 Jul. 1, 2004

(30) Foreign Application Priority Data

Dec. 27, 2002 (KR) .................................. 10-2002-0085159
Dec. 28, 2002 (KR) .................................. 10-2002-0085808

(51) Int. Cl.[7] ................................................ G11C 7/00
(52) U.S. Cl. .......................... 365/189.02; 365/189.05; 365/230.04
(58) Field of Search ....................... 365/189.02, 189.05, 365/230.04

(56) References Cited

U.S. PATENT DOCUMENTS

| | | | | |
|---|---|---|---|---|
| 4,954,987 A | * | 9/1990 | Auvinen et al. | ........ 365/189.02 |
| 5,331,600 A | * | 7/1994 | Higuchi | ................. 365/230.04 |
| 5,881,017 A | | 3/1999 | Matsumoto et al. | |
| 6,085,300 A | | 7/2000 | Sunaga et al. | |
| 6,134,153 A | * | 10/2000 | Lines et al. | ............ 365/189.02 |
| 6,154,416 A | | 11/2000 | Lee et al. | |
| 6,381,180 B1 | | 4/2002 | Merritt et al. | |
| 6,556,494 B2 | | 4/2003 | Morzano et al. | |
| 2002/0131313 A1 | | 9/2002 | Morzano et al. | |
| 2002/0186608 A1 | | 12/2002 | Morzano et al. | |
| 2003/0021177 A1 | | 1/2003 | La | |

FOREIGN PATENT DOCUMENTS

JP          10-040678          2/1998

* cited by examiner

*Primary Examiner*—Huan Hoang
(74) *Attorney, Agent, or Firm*—Blakely Sokoloff Taylor & Zafman

(57) ABSTRACT

A semiconductor memory device includes an advanced prefetching block for prefetching more bit data at once and effectively arranging the prefetched data so as to reduce an address access time of the semiconductor memory device. The semiconductor memory device having four pipelining latches for prefetching 4-bit data outputted from at least one bank in response to a start address of the 4-bit data and control signals includes a first data multiplexing unit, a second data multiplexing unit, a third order multiplexing unit and a forth order multiplexing unit.

18 Claims, 12 Drawing Sheets

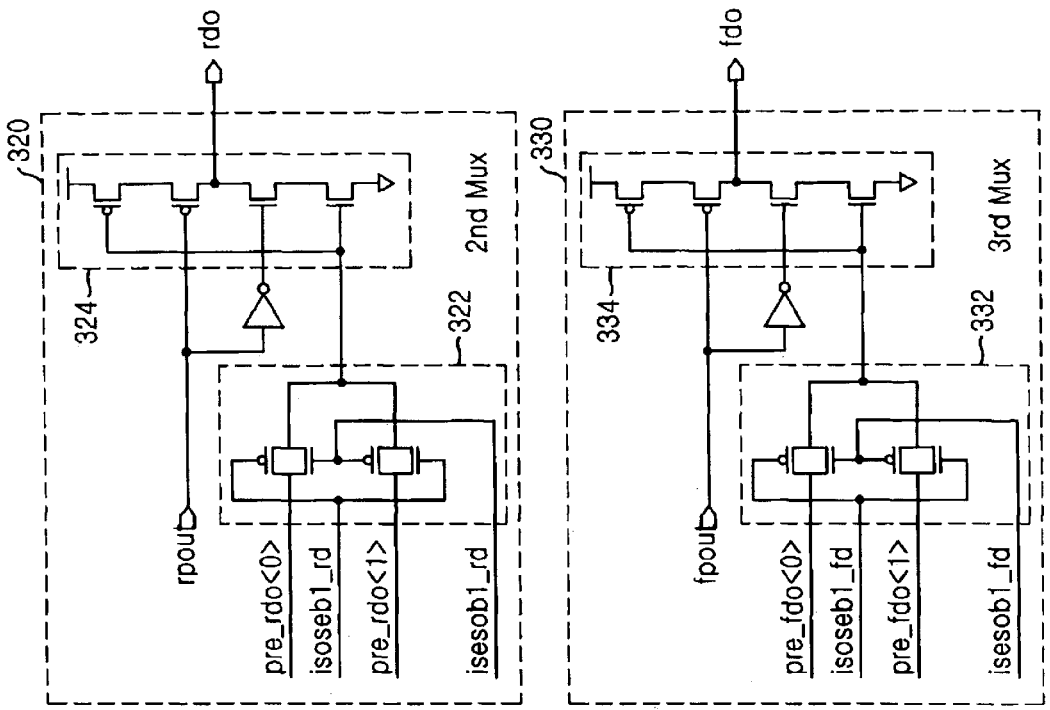
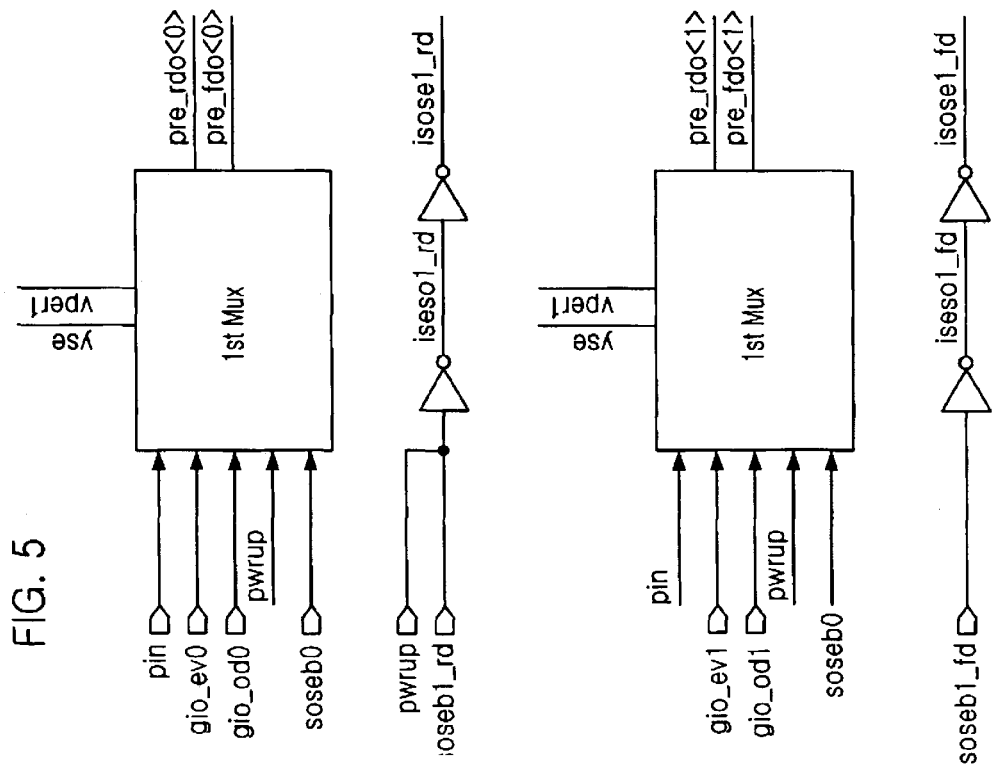
FIG. 5

|  | A:"H"<br>B:DON'T CARE | A:"L"<br>B:"H" | A:"L"<br>B:"L" |
|---|---|---|---|
| OUT | HIGH | LOW | HIGH |
| OUTB | HIGH | HIGH | LOW |

SEMICONDUCTOR MEMORY DEVICE HAVING ADVANCED PREFETCH BLOCK

FIELD OF THE INVENTION

The present invention relates to a semiconductor memory device; and, more particularly, to prefetch a 4-bit data at once and effectively arrange the prefetched data in pipelining latches.

DESCRIPTION OF THE PRIOR ART

In a conventional semiconductor memory device, two data are prefetched at once. Namely, each of the two data are simultaneously prefetched through different paths by one instruction for reading data stored in the cells of the semiconductor memory device. The two data can be inputted in serial or parallel. The two latched data is outputted according to a rising and a falling edge of a clock signal.

Today, the semiconductor memory device should be operated on higher speed. Typically, a frequency of the clock signal is increased for fast operation of the semiconductor memory device, but there is a limit to using the above mentioned method for prefetching data. Thus, it is needed to access and prefetch more bit data at once.

In addition, the read data prefetched at once should be used effectively. If it takes a long time to arrange a lot of data which are prefetched at once, the delay time is increased and, as a result, the semiconductor memory device can rather operate slowly. For example, although more pipelining latches are used for prefetching data, an address access time tAA is increased, if a lot of the prefetched data should be arranged in the pipelining latches. It is because the address access time tAA includes a latching time for latching the prefetched data in pipelining latches and outputting to an output driver.

SUMMARY OF INVENTION

It is, therefore, an object of the present invention to provide a semiconductor memory device having an advanced prefetching block for prefetching multiple bits of data at once and effectively arranging the prefetched data so as to reduce an address access time of the semiconductor memory device.

In accordance with an aspect of the present invention, there is provided the semiconductor memory device having four pipelining latches for prefetching 4-bit data outputted from at least one bank in response to a start address of the 4-bit data and control signals including a first data multiplexing unit for receiving a first even datum from a first even line and a first odd datum from a first odd line and determining a data path of each of the first even and odd data between first & second data paths according to a data assigning control signal and outputting a first datum through the first data path and outputting a second datum through the second data path; a second data multiplexing unit for receiving a second even datum from a second even line and a second odd datum from a second odd line and determining a data path of each of the second even and odd data between third & forth data paths according to the data assigning control signal and outputting a third datum through the third data path and outputting a forth datum through the forth data path; a third order multiplexing unit for receiving the first datum from the first data path and the third datum from the third data path and sequentially outputting the first and the third data at a rising edge of a first control signal in response to the start address of the inputted data; and a forth order multiplexing unit for receiving the second datum from the second data path and the forth datum from the forth data path and sequentially outputting the second and forth data to a falling edge of a second control signal in response to the start address of the inputted data, wherein the 4-bit data is split into the first even data, the first odd data, the second even data and the second odd data, and the data assigning control signal is used for arranging a inputted data into a data path according to whether the start address of the inputted data is an even number or an odd number.

In accordance with an aspect of the present invention, there is provided the semiconductor memory device for prefetching 4-bit data from at least one bank in response to an instruction for reading data including a first control signal generating unit for generating a first and a second control signals generated by logically combining a data input control signal with a data output control signal; a second control signal generating unit for generating a third control signal and a forth control signal, the third control signal generated by logically combining a odd enable signal which is used for outputting an odd times data with a odd arranging signal which is used for arranging the odd times data in response to a start address of the 4-bit data, the forth controls signal generated by logically combining a even enable signal which is used for outputting an even times data with a even arranging signal which is used for arranging the even times data in response to a start address of the 4-bit data; and a signal delivering unit controlled by the first, the second and the third control signals for outputting the 4-bit data to a first and a second even data output lines and a first and a second odd data output lines.

BRIEF DESCRIPTION OF THE DRAWINGS

The above and other objects and features of the present invention will become apparent from the following description of preferred embodiments taken in conjunction with the accompanying drawings, in which:

FIG. 5 is a schematic diagram showing a second and a third multiplexing blocks in the pipelining latch shown in FIG. 3;

DETAILED DESCRIPTION OF INVENTION

Hereinafter, a semiconductor memory device according to the present invention will be described in detail referring to the accompanying drawings.

Figure 1:
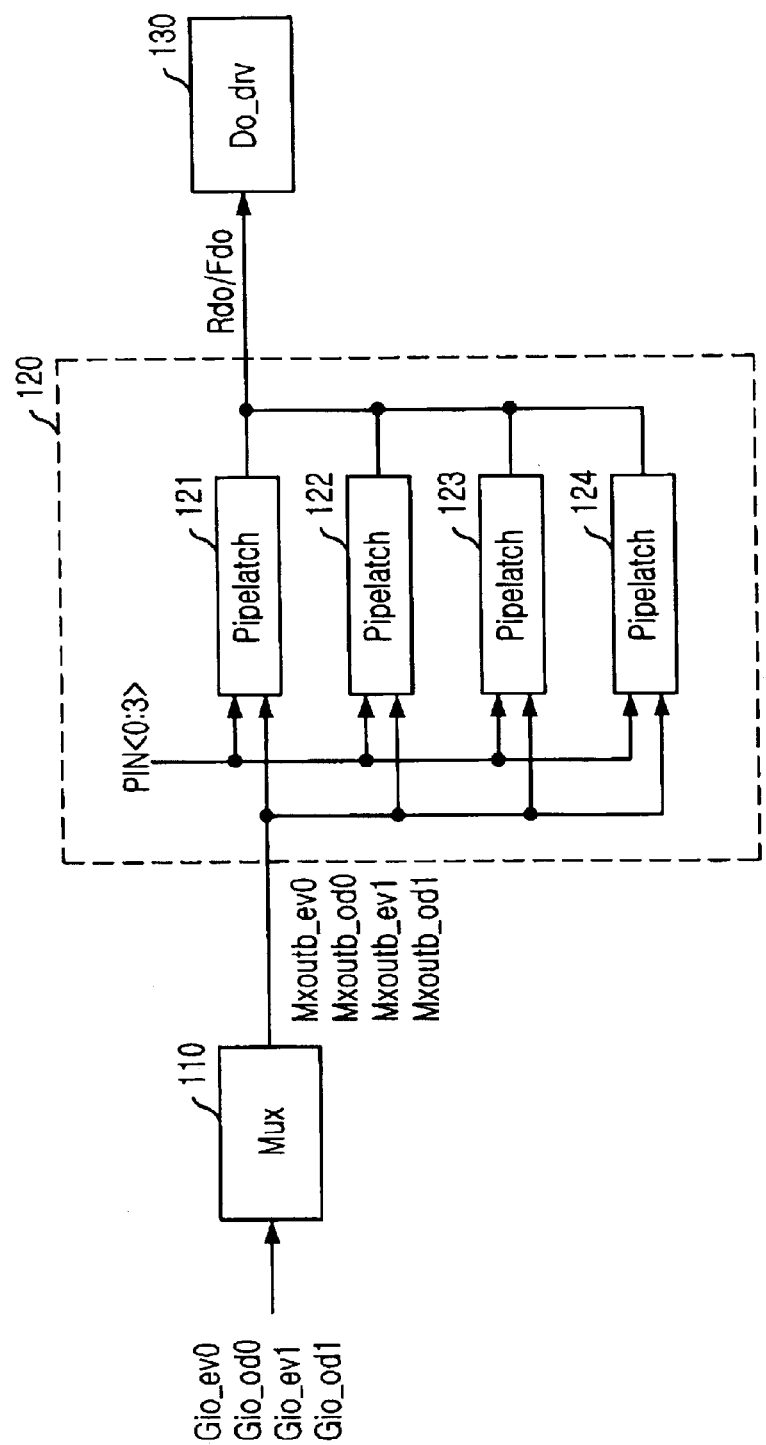
FIG. 1 is a block diagram showing pipelining latches block of a semiconductor memory device in accordance with a preferred embodiment of the present invention.

FIG. 1 is a block diagram showing pipelining latches block of a semiconductor memory device in accordance with a preferred embodiment of the present invention.

As shown, the semiconductor memory device inputs four input data to a global input/output line GIO. The global input/output line GIO includes two even global lines GIO__EV0 and GIO__EV1 and two odd global lines GIO__OD0 and GIO__OD1. For instance, four data can be assigned to the global input/output line GIO: a data corresponding to an address, e.g., A<0>, is delivered through the even global line GIO__EV0; another data corresponding to an address, e.g., A<1>, is delivered through the odd global line GIO__OD0; a data corresponding to another address, e.g., A<2>, is delivered through the even global line GIO__EV1; and another data corresponding to an address, e.g., A<3>, is delivered through the odd global line GIO__OD1. The pipelining latches block receives the four data through the global input/output line GIO by one read instruction. Herein, RDO and FDO are data output lines for outputting the four data according to a rising edge and a falling edge of a control signal.

The pipelining latches block including four latches are controlled by an enable signal PIN<0:3> which serves as controlling whether the pipelining latches block receives four data passing through a multiplexing unit 110. If the enable signal PIN<0:3> is in logical low, the four data is inputted to each latches of the pipelining latches block.

Figure 2:
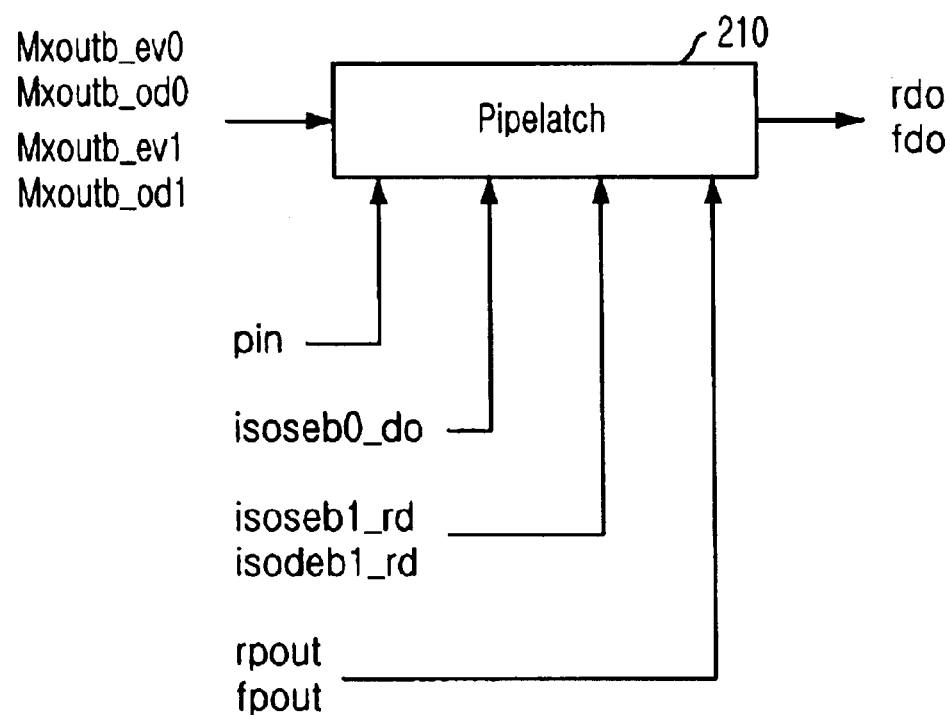
FIG. 2 is a block diagram showing input values, control signals and output values of the pipelining latch.

FIG. 2 is a block diagram showing input values, control signals and output values of the pipelining latch.

As shown, the four data inputted to the pipelining latches block should be arranged four times for orderly latching the four data to the four pipelining latches and outputting the four data to the output driver. For example, in first step, the four data are controlled by the enable signal PIN<0:3>; in second step, the four data are arranged by a data address assigning signal ISOSEB0__DO; in third step, the four data are arranged by a even assigning signal ISOSEB1__RD and a odd assigning signal ISOSEB1__FD; finally, in forth step, the four latched data of the four pipelining latches is outputted to a rising edge output line RDO and a falling edge output line FDO by a first and a second output control signal RPOUT and FPOUT.

Herein, the data address assigning signal ISOSEB0__DO is a control signal for arranging the four data inputted to the four pipelining latches according to whether a start address of the four data is an even number or an odd number.

Figure 3:
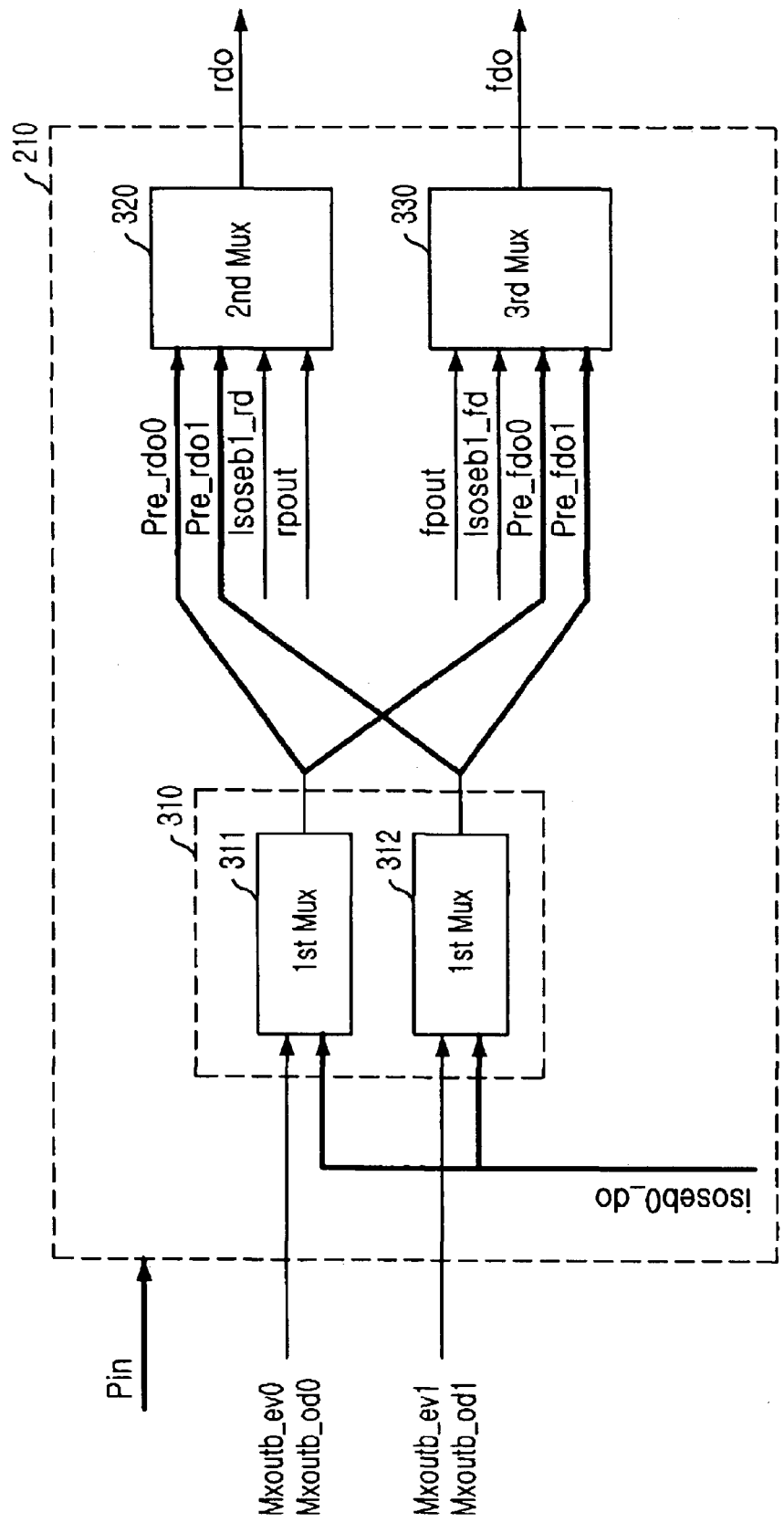
FIG. 3 is a block diagram showing the pipelining latch shown in FIG. 2 in detail.

FIG. 3 is a block diagram showing the pipelining latch shown in FIG. 2 in detail.

The pipelining latch in accordance with a first embodiment of the present invention includes a first data multiplexing unit for receiving two data through a first even output line and a first odd output line and arranging inputted data into a first and a second type data and outputting a first and a second data to a first and a second paths in response to a data assigning control signal, a second data multiplexing unit for receiving two data through a second even output line and a second odd output line and arranging inputted data into the first-type and the second-type data and outputting a third and a second data to a third and a forth paths in response to a data assigning control signal, a third order multiplexing unit for receiving the first and the third data outputted from the first and the second data multiplexing unit and outputting the arranged data to a first data output lines in response to several control signals, and a forth order multiplexing unit for receiving the second and the forth data outputted from the first and the second data multiplexing unit and outputting the arranged data to a second data output lines in response to several control signals. Herein, the data address assigning signal is a control signal for arranging the inputted data according to whether a start address of the inputted data is an even number or an odd number.

If the start address of the four data is an even number, the first data multiplexing unit outputs the first data inputted through the first even output line MXOUTB__EV0 to the first path PRE__RDO0 and the second data inputted through the first odd output line MXOUTB__OD0 to the second path PRE__FDO0. In the same condition, the second data multiplexing unit outputs the third data inputted through the second even output line MXOUTB__EV1 to the forth path PRE__RDO1 and the forth data inputted through the second odd output line MXOUTB__OD1 to the forth path PRE__FDO1.

Hereinafter, there is described an arranging order of the third and the forth multiplexing units 320 and 330.

If the start address is 0, the four data is outputted to the first and the second data output lines RDO and FDO by the next order.

1. PRE__RDO0→RDO of the third multiplexing unit
2. PRE__FDO0→FDO of the forth multiplexing unit
3. PRE__RDO1→RDO of the third multiplexing unit
4. PRE__FDO1→FDO of the forth multiplexing unit If the start address is 2, the four data is outputted to the first and the second data output lines RDO and FDO by the next order.

1. PRE__RDO1→RDO of the third multiplexing unit
2. PRE__FDO1→FDO of the forth multiplexing unit
3. PRE__RDO0→RDO of the third multiplexing unit
4. PRE__FDO0→FDO of the forth multiplexing unit If the start address of the four data is an odd number, the first data multiplexing unit outputs the first data inputted through the first odd output line MXOUTB__OD0 to the first path PRE__RDO0 and the second data inputted through the first even output line MXOUTB__EV0 to the second path PRE__FDO0. In the same condition, the second data multiplexing unit outputs the third data inputted through the second odd output line MXOUTB__OD1 to the forth path PRE__RDO1 and the forth data inputted through the second even output line MXOUTB__EV1 to the forth path PRE__FDO1.

Hereinafter, there is described an arranging order of the third and the forth multiplexing units 320 and 330.

If the start address is 1, the four data is outputted to the first and the second data output lines RDO and FDO by the next order.

1. PRE__RDO0→RDO of the third multiplexing unit
2. PRE__FDO1→FDO of the forth multiplexing unit
3. PRE__RDO1→RDO of the third multiplexing unit
4. PRE__FDO0→FDO of the forth multiplexing unit If the start address is 2, the four data is outputted to the first and the second data output lines RDO and FDO by the next order.

Figure 4:
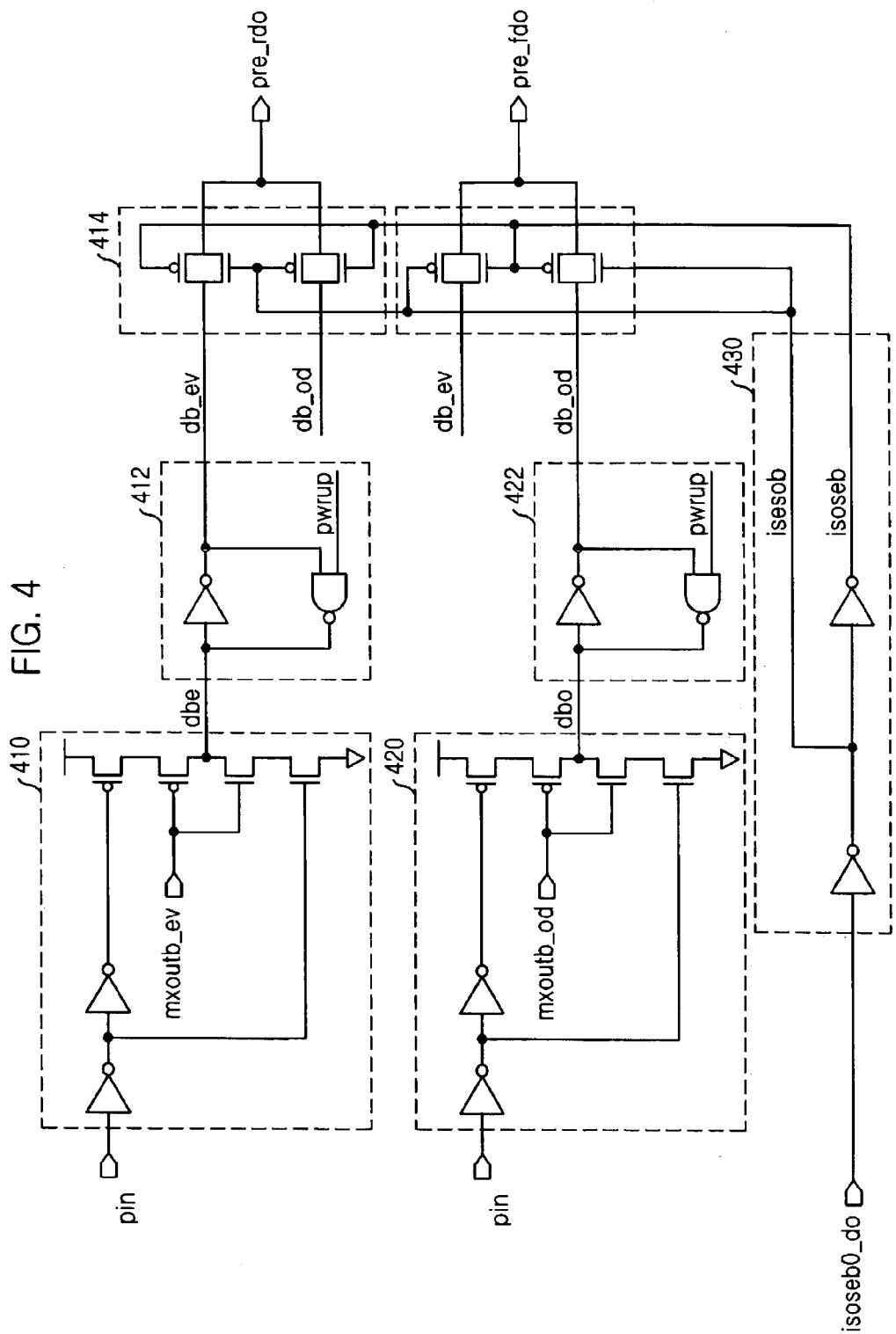
FIG. 4 is a schematic diagram showing a first multiplexing block in the pipelining latch shown in FIG. 3.
Figure 6:
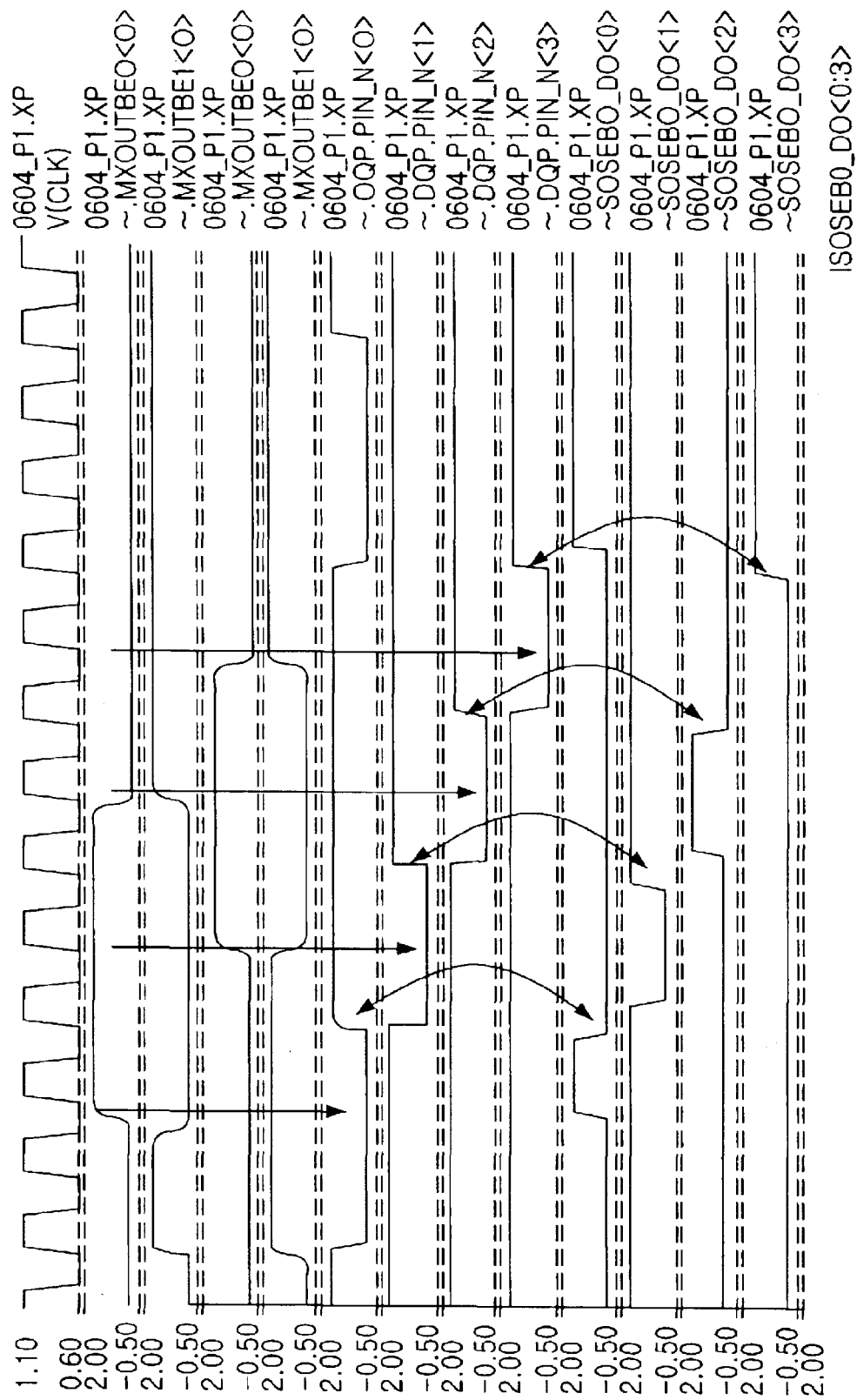
FIG. 6 is a timing diagram showing operation of the first multiplexing blocks shown in FIG. 4.

1. PRE__RDO1→RDO of the third multiplexing unit
2. PRE__FDO0→FDO of the forth multiplexing unit
3. PRE__RDO0→RDO of the third multiplexing unit
4. PRE__FDO1→FDO of the forth multiplexing unit FIG. 4 is a schematic diagram showing a first multiplexing block in the pipelining latch shown in FIG. 3. FIG. 6 is a timing diagram showing operation of the first multiplexing blocks shown in FIG. 4.

As shown in FIG. 4, the pipelining latches receive the inputted data if the enable signal PIN<0:3> is in logical low.

If the enable signal PIN<0:3> is in logical high, the latches do not receive any data. According to whether the start address of the inputted 4-bit data is an odd number or an even number, the first multiplexing unit can outputs the inputted data to the first and the second paths. If the start address is the even number, the first data which is outputted to the first path PRE RDO<O> is a data inputted through the even output line and the second data which is outputted to the second path PRE_FDO<O> is a data inputted through the odd output line. Otherwise, if the start address is the odd number, the first data which is outputted to the first path PRE RDO<O> is the data inputted through the odd output line and the second data which is outputted to the second path PRE_FDO<O> is the data inputted through the even output line.

Furthermore, the second multiplexing unit outputs the third and the forth data to the third and the forth paths like above manner. If the start address is the even number, the third data which is outputted to the third path PRE RDO<1> is a data inputted through the even output line and the forth data which is outputted to the forth path PRE FDO<1> is a data inputted through the odd output line. Otherwise, if the start address is the odd number, the third data which is outputted to the third path PRE RDO<1> is the data inputted through the odd output line and the forth data which is outputted to the forth path PRE_FDO<1> is the data inputted through the even output line.

The first multiplexing 311 unit includes a first data input block 410, a second data input block 420, a first latch block 412, a second latch block 422, a decision logic 430, a first data output block 414 and a second data output block 424.

The first data input block 410 receives a first inputted data through the even data line in response to an input control signal. The second data input block 420 receives a second inputted data through the odd data line in response to the input control signal. The first latch block 412 temporary stores the outputted data from the first data input block, a second latch block 422 for temporary storing the outputted data from the second data input block. The decision logic 430 for receiving the starting address of the inputted data and outputting a first and a second logical signals according to whether the starting address of the inputted data is an odd number or an even number. Herein, the logical state of the first logical signal is opposite to that of the second logical signal. The first data output block 414 outputs the stored data of the first latch block to the first path in response to the first and the second logical signals. The second data output block 424 outputs the stored data of the second latch block to the second path in response to the first and the second logical signals.

Figure 7:
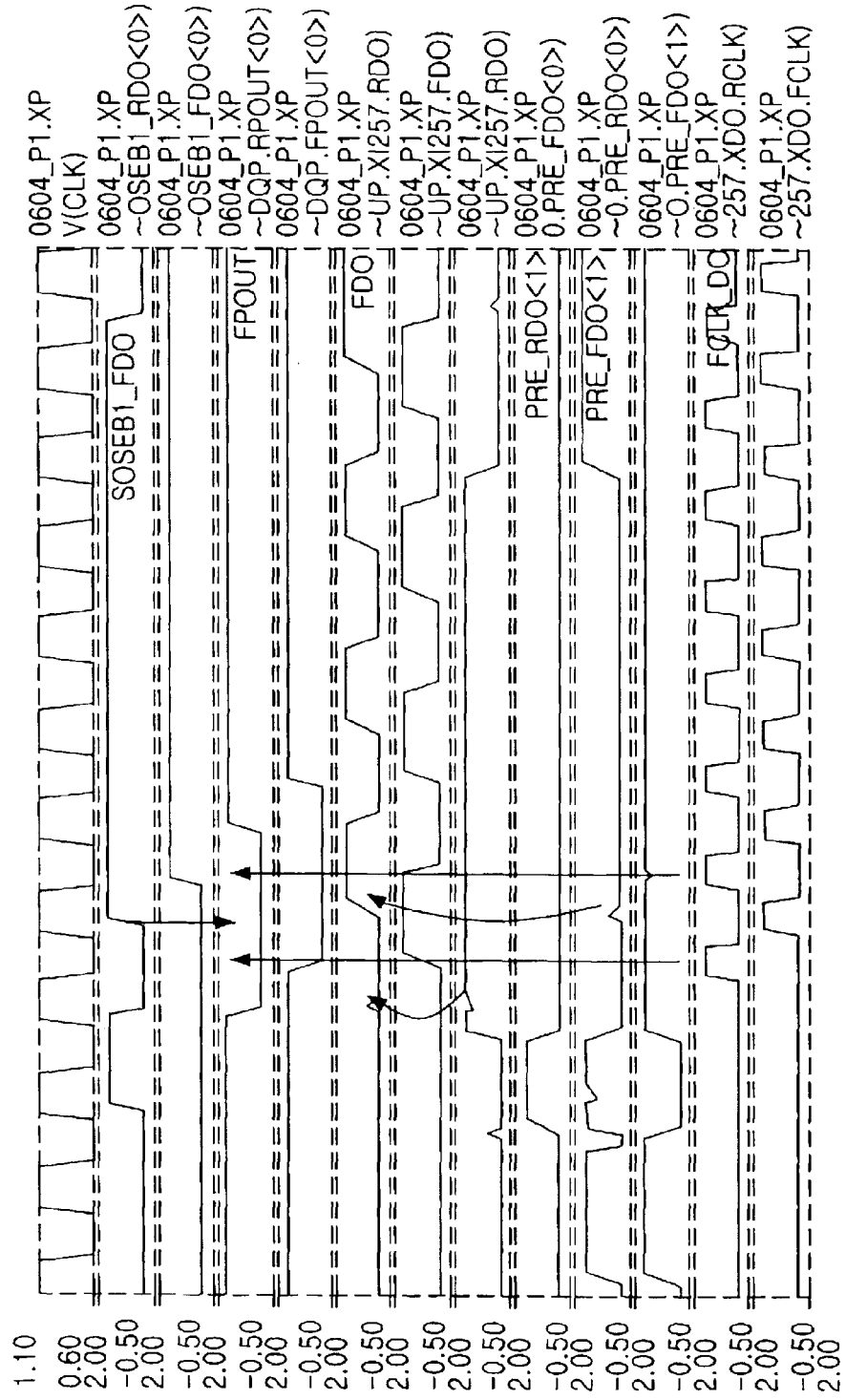
FIG. 7 and FIG. 8 are timing diagrams individually showing operation of the second and the third multiplexing blocks shown in FIG. 5.
Figure 8:
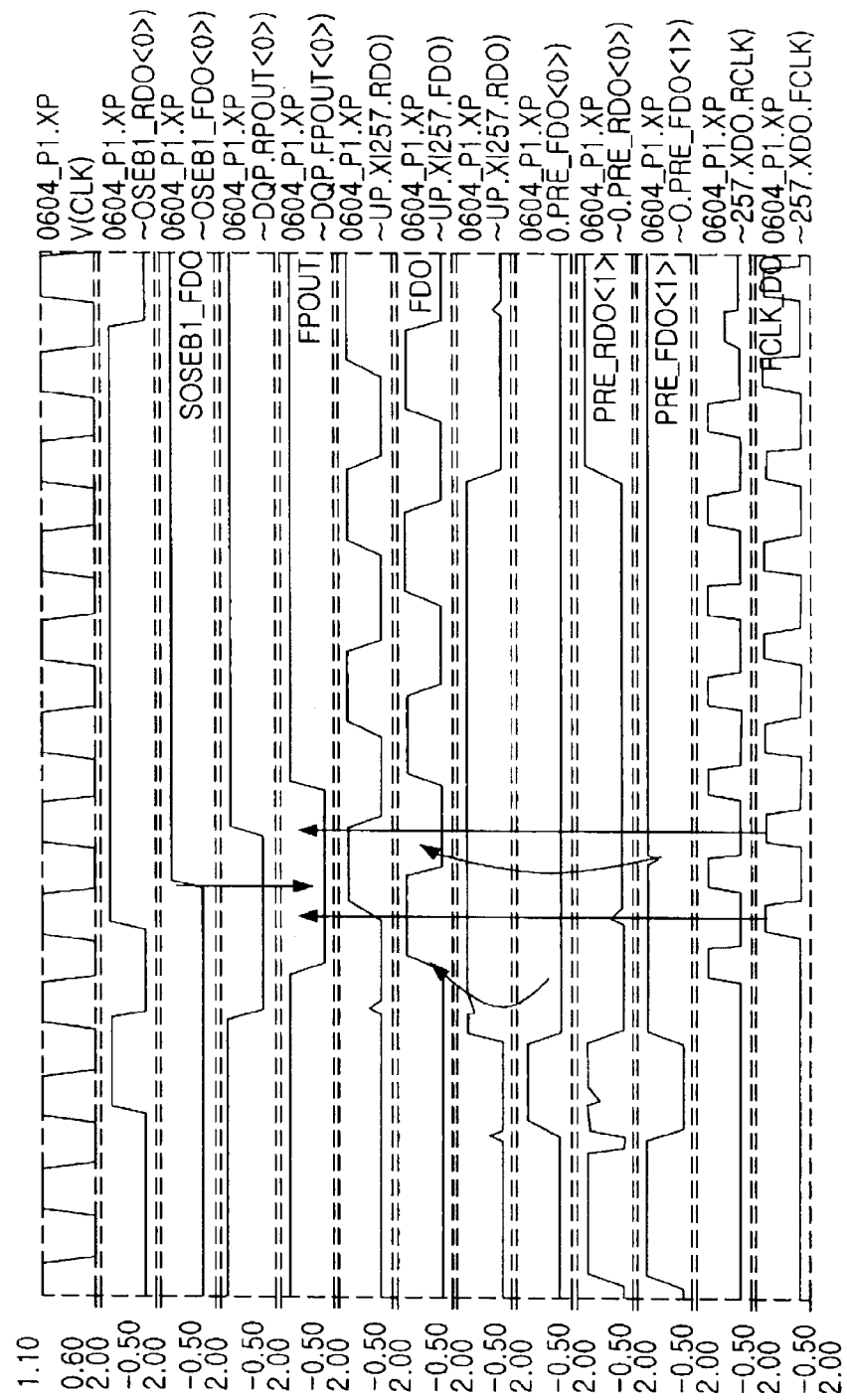

FIG. 5 is a schematic diagram showing a second and a third multiplexing blocks in the pipelining latch shown in FIG. 3. FIGS. 7 and 8 are timing diagrams individually showing operation of the second and the third multiplexing blocks shown in FIG. 5.

The third multiplexing unit 320 outputs the first data to the first data output line RDO at a rising edge of a control signal and the third data to the first data output line at next rising edge of the control signal in response to a predetermined value of the start address.

The third multiplexing unit 320 outputs the third data to the first data output line RDO at a rising edge of a control signal and the first data to the first data output line at next rising edge of the control signal in response to. another predetermined value of the start address.

The third multiplexing unit includes a data select block 322 and an output control block 324.

The data select block 322 has a first and a second passgates for passing the first data and the third data according to a third logical signal ISOSEB1 RD. Gates of a PMOS transistor in the first passgate and a NMOS transistor in the second passgate are coupled to the third logical signal ISOSEB1 RD. Gates of a NMOS transistor in the first passgate and a PMOS transistor in the second passgate are coupled to the converted third logical signal ISESOB1 RD.

The output control block 324 has a first and a second PMOS transistors and a first and a second NMOS transistor which are serially connected between a supply voltage and a ground voltage. Gates of the first PMOS transistor and the second NMOS transistor are coupled to an output signal of the data select block. Gate of the second PMOS transistor is coupled to a rising edge output signal RPOUT. Gate of the first NMOS transistor is coupled to the inversed rising edge output signal/RPOUT. Herein, the third logical signal ISOSEB1_RD is used for arranging an odd number times data in response to the start address and the rising edge output signal is used for outputting the output signal of the data select block at a rising edge of a first and a second clock pulse.

The forth multiplexing unit 330 outputs the second data to the second data output line at a falling edge of the control signal and the forth data to the second data output line at next falling edge of the control signal in response to a predetermined value of the start address.

The forth multiplexing unit 330 outputs the forth data to the second data output line at a falling edge of the control signal and the second data to the second data output line at next falling edge of the control signal in response to another predetermined value of the start address.

The forth multiplexing unit 330 includes a data select block 332 and an output control block 330.

The data select block 332 has a first and a second passgates for passing the first data and the third data according to a forth logical signal ISOSEBI FD. Gates of a PMOS transistor in the first passgate and a NMOS transistor in the second passgate are coupled to the forth logical signal ISOSEBI_FD. Gates of a NMOS transistor in the first passgate and a PMOS transistor in the second passgate are coupled to the inversed forth logical signal ISESOB1 FD.

The output control block 330 has a first and a second PMOS transistors and a first and a second NMOS transistors which are serially connected between a supply voltage and a ground voltage. Gates of the first PMOS transistor and the second NMOS transistor are coupled to an output signal of the data select block. Gate of the second PMOS transistor is coupled to a falling edge output signal FPOUT. Gate of the first NMOS transistor is coupled to the inversed falling edge output signal /FPOUT. Herein, the forth logical signal ISOSEBI FD is used for arranging an even number times data in response to the start address and the falling edge output signal is used for outputting the output signal of the data select block at a falling edge of a first and a second clock pulse.

If the start address is 0, operation of the third multiplexing unit 320 can be described as following statement. First, a first data of PRE RDO<0> is delivered to RDO and, then the first data of RDO is outputted at a rising edge RCLK DO of a first clock pulse. After that, according to whether the start address is an odd number or an even number, ISOSEB1_RD is toggled and the third data of Pre_RD<1> is delivered to RDO. Then, the third data of RDO is outputted at a rising edge RCLK_DO of a second clock pulse.

If the start address is 0, operation of the forth multiplexing unit 330 can be described as following statement. First, a second data of PRE FDO<0> is delivered to RDO and, then the second data of FDO is outputted at a falling edge FCLK_DO of a first clock pulse. After that, according to whether the start address is an odd number or an even number, ISOSEBI FD is toggled and the forth data of PRE FDO<1> is delivered to RDO. Then, the forth data of FDO is outputted at a falling edge FCLK DO of a second clock pulse.

Figure 9:
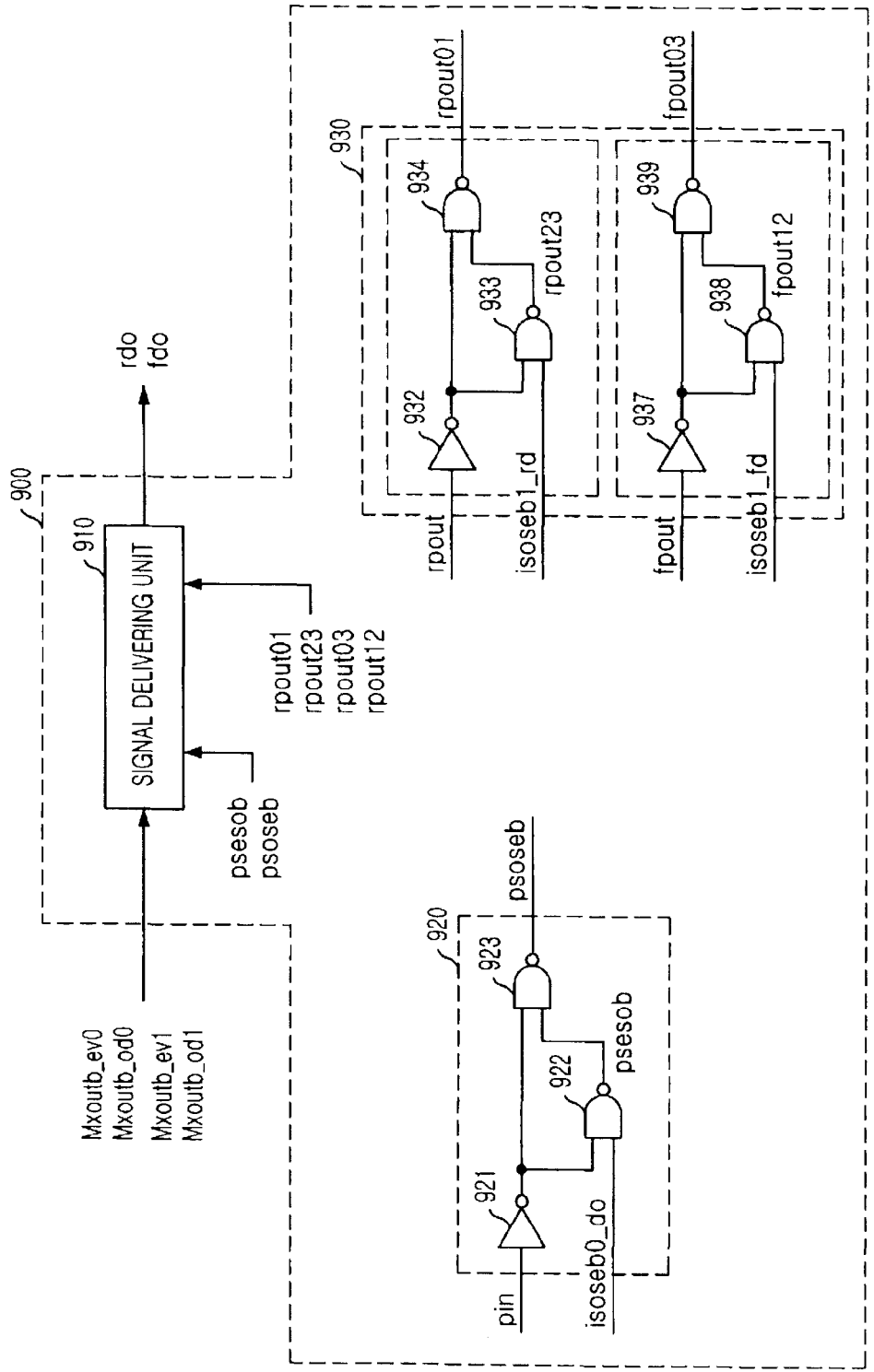
FIG. 9 is a block diagram showing pipelining latches block of the semiconductor memory device in accordance with another preferred embodiment of the present invention.

FIG. 9 is a block diagram showing pipelining latches block of the semiconductor memory device in accordance with another preferred embodiment of the present invention.

The pipelining latch block 900 includes a signal delivering unit 910, a first control signal generating unit 920 and a second control signal generating unit 930.

The signal delivering unit 910 controlled by the first, the second and the third control signals outputs the 4-bit data to a first and a second even data output lines and a first and a second odd data output lines.

The first control signal generating unit 920 generates generating a first and a second control signals generated by logically combining a data input control signal PIN with a data output control signal ISOSEBO DO.

The first control signal generating unit 920 includes an inverter 921 receiving the data input control signal PIN, a first NAN 922 gate 922 for receiving the data output signal ISOSEBO DO and an output of the inverter and generating the first control signal PSESOB, and a second NAND gate 923 for receiving the output of the inverter and an output of the first NAND gate and generating the second control signal PSOSEB.

The second control signal generating unit 930 generates a third control signal and a forth control signal. The third control signal is generated by logically combining an odd enable signal RPOUT which is used for outputting an odd times data with an odd arranging signal ISOSEBI RD which is used for arranging the odd times data in response to a start address of the 4-bit data. The forth controls signal is generated by logically combining a even enable signal FPOUT which is used for outputting an even times data with a even arranging signal ISOSEBI_FD which is used for arranging the even times data in response to a start address of the 4-bit data.

The second control signal generating unit 930 includes an odd data control block 931 and an even data control block 936.

The odd data control block 931 generates the third control signal by logically combining the odd enable signal RPOUT with the odd arranging signal ISOSEBI RD. The odd data control block 931 includes an inverter 932 receiving the odd enable signal RPOUT, a first NAND gate 933 for receiving the odd arranging signal ISOSEBI RD and an output of the inverter 932 and generating a prior third control signal RPOUT01, and a second NAND gate 934 for receiving the output of the inverter 932 and an output of the first NAND gate 933 and generating a later third control signal RPOUT23.

The even data control block 936 generates the forth control signal by logically combining the even enable signal FPOUT with the even arranging signal ISOSEBI FD. The even data control block 936 includes an inverter 937 receiving the even enable signal, a first NAND gate 938 for receiving the even arranging signal ISOSEBI_FD and an output of the inverter 937 and generating prior the forth control signal FPOUT03, and a second NAND gate 939 for receiving the output of the inverter 937 and an output of the first NAND gate 938 and generating later the forth control signal FPOUT12.

Figure 10:
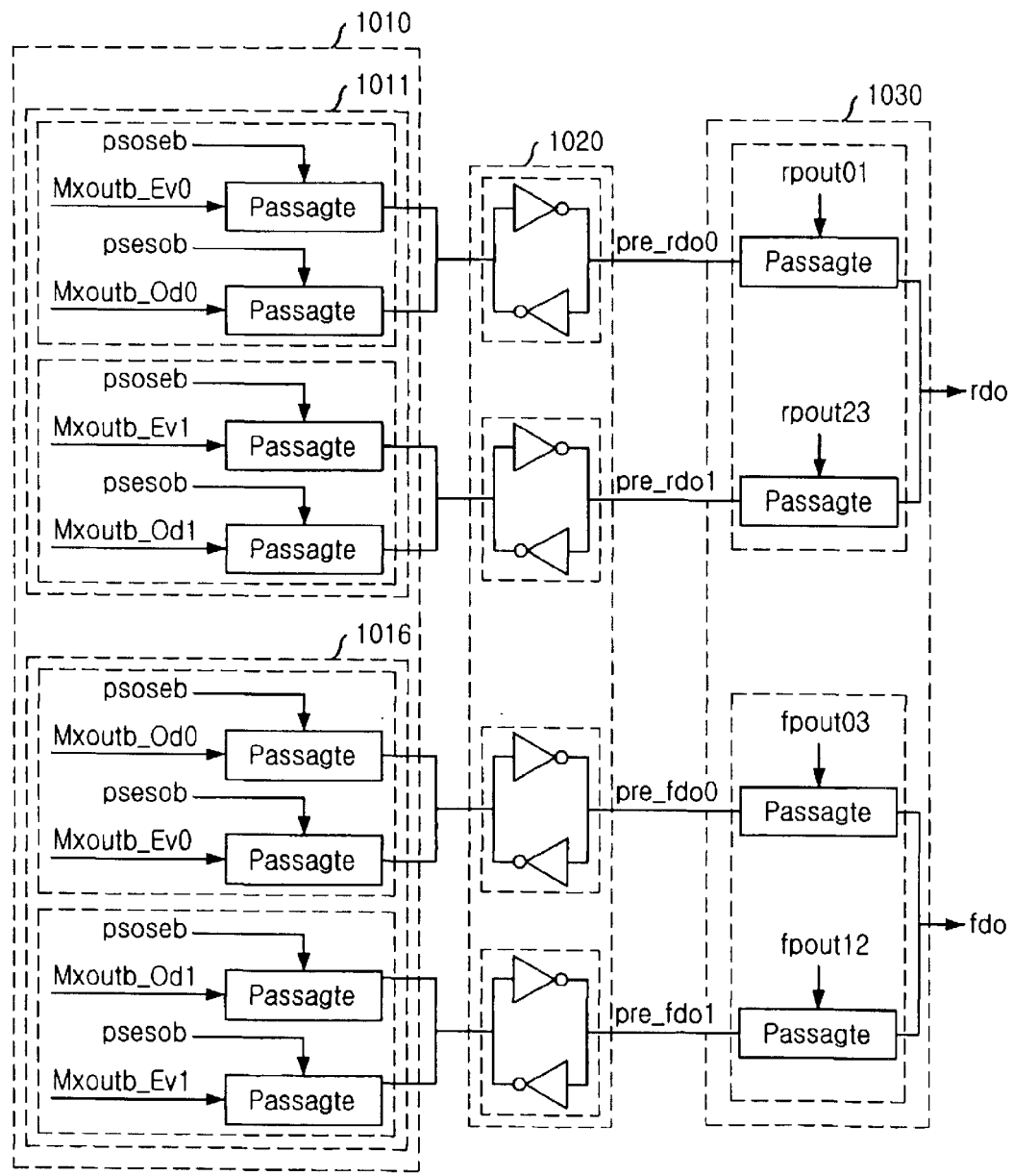
FIG. 10 is a block diagram showing the pipelining latch shown in FIG. 9 in detail.

FIG. 10 is a block diagram showing the pipelining latch block 900 shown in FIG. 9 in detail.

As shown, the signal delivering unit 910 includes a first data arranging unit 1010 controlled by the first control signal for arranging the inputted data, a latch unit 1020 for temporary storing data outputted from the first data arranging unit, and a second data arranging unit 1030 for arranging and outputting the stored data in the latch unit.

Referring to FIG. 10, there is described operation of the signal delivering unit 910. If PSOSEB is in logical low, each data of MXOUTB EV0 and MXOUTB EV1 is delivered into each of PRE_RDO0 and PRE DRO1. The delivered data of PRE RDO0 and PRE_DRO1 is outputted in response to several control signals RPOUT01, RPOUT23 and FPOUT03 which are generated from the second control signal generating unit 930.

Figure 11A:
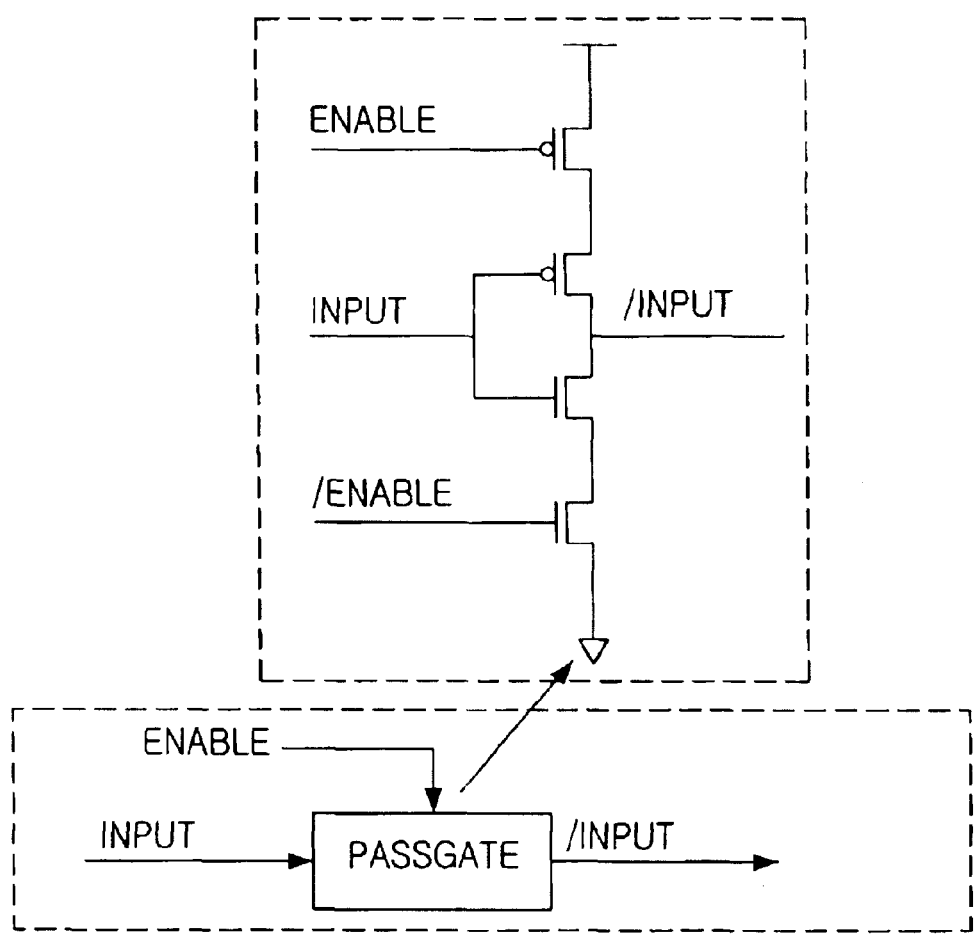
FIG. 11A is a schematic diagram showing a passgate block shown in FIG. 10.
Figure 11B:
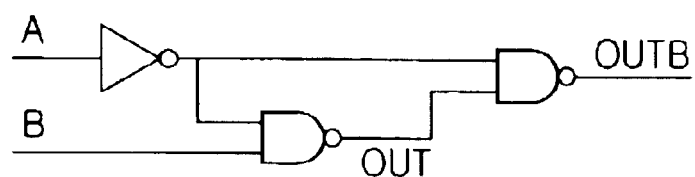
FIG. 11B is a schematic diagram and a true/false table of a first and a second control signal generator.

FIG. 11A is a schematic diagram showing a passgate block shown in FIG. 10, and FIG. 11B is a schematic diagram and a true/false table of a first and a second control signal generator. Any description about FIG. 11A and FIG. 11B is omitted because the passage and the control signal generators are just supplementary blocks for describing the present invention and are not newly inventive and complicate.

According to the present invention, the memory device can prefetch 4-bit data at once. As a result, operation speed of the memory device is doubled, and the memory device has the advantage of overcoming critical problems occurred by high speed operation of the memory device. In addition, if steps of arranging data for prefetching data into latches are reduced, a data access time is decreased.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device having four pipelining latches for prefetching 4-bit data outputted from at least one bank in response to a start address of the 4-bit data and control signals, comprising:

a first data multiplexing means for receiving a first even datum from a first even line and a first odd datum from a first odd line and determining a data path of each of the first even and odd data between first & second data paths according to a data assigning control signal and outputting a first datum through the first data path and outputting a second datum through the second data path;

a second data multiplexing means for receiving a second even datum from a second even line and a second odd datum from a second odd line and determining a data path of each of the second even and odd data between third & fourth data paths according to the data assigning control signal and outputting a third datum through the third data path and outputting a fourth datum through the fourth data path;

a third order multiplexing means for receiving the first datum from the first data path and the third datum from the third data path and sequentially outputting the first and the third data at a rising edge of a first control signal in response to the start address of the inputted data; and a fourth order multiplexing means for receiving the second datum from the second data path and the fourth datum from the fourth data path and sequentially outputting the second and fourth data to a falling edge of a second control signal in response to the start address of the inputted data, wherein the 4-bit data is split into the first even data, the first odd data, the second even data and the second odd data, and the data assigning control signal is used for arranging the inputted data into a data path according to whether the start address of the inputted data is an even number or an odd number.

2. The semiconductor memory device of claim 1, wherein the first datum is the first even datum and the second datum is the first odd datum if the start address of the inputted 4-bit data is an even number, and the first datum is the first odd datum and the second datum is the first even datum if the start address of the inputted 4-bit data is an odd number.

3. The semiconductor memory device of claim 2, wherein the third datum is the second even datum and the fourth datum is the second odd datum if the start address of the inputted 4-bit data is an even number, and the third datum is the second add datum and the fourth datum is the second even datum if the start address of the inputted 4-bit data is an odd number.

4. The semiconductor memory device of claim 3, wherein the first multiplexing means includes:
   a first data input block for receiving the first even data through the first even line in response to an input control signal;
   a second data input block for receiving the first odd data through the odd line in response to the input control signal;
   a first latch block for temporary storing the first even data outputted from the first data input block;
   a second latch block for temporary storing the first odd data outputted from the second data input block;
   a decision logic for receiving the starting address of the first even/odd data and outputting the data assigning control signal according to whether the starting address of the inputted 4-bit data is an odd number or an even number;
   a first data output block for outputting the first even data to the first data path in response to the data assigning control signal; and
   a second data output block for outputting the first odd data of the second data path in response to the data assigning control signal.

5. The semiconductor memory device of claim 4, wherein the second multiplexing means includes elements which serve as the elements included in the first multiplexing means.

6. The semiconductor memory device of claim 5, wherein the third multiplexing means sequentially outputs each of the first datum and the third datum at each of a rising edge and a next rising edge of the first control signal in response to a predetermined value of the start address.

7. The semiconductor memory device of claim 6, wherein the fourth multiplexing means sequentially outputs each of the second datum and the fourth datum at a falling edge and a next falling edge of the second control signal in response to the predetermined value of the start address.

8. The semiconductor memory device of claim 7, wherein the third multiplexing means includes:
   a first data select block having a first and a second passgates for passing the first datum and the third datum according to a third logical signal, gates of a PMOS transistor in the first passgate and a NMOS transistor in the second passgate being coupled to the third logical signal and gates of a NMOS transistor in the first passgate and a PMOS transistor in the second passgate being coupled to the inversed third logical signal; and
   a first output control block having a first and a second PMOS transistors and a first and a second NMOS transistor which are serially connected between a supply voltage and a ground voltage, gates of the first PMOS transistor and the second NMOS transistor being coupled to an output signal of the data select block and gate of the second PMOS transistor being coupled to a rising edge output signal and gate of the first NMOS transistor being coupled to the inversed rising edge output signal,
   wherein the third logical signal is used for arranging an odd number times data in response to the start address and the rising edge output signal is used for outputting the output signal of the first data select block at a rising edge of a first and a second clock pulse.

9. The semiconductor memory device of claim 8, wherein the fourth multiplexing means includes:
   a second data select block having a third and a fourth passgates for passing the first data and the third data according to a fourth logical signal, gates of a PMOS transistor in the third passgate and a NMOS transistor in the forth passgate being coupled to the third logical signal and gates of a NMOS transistor in the fourth passgate and a PMOS transistor in the fourth passgate being coupled to the inversed fourth logical signal; and
   a second output control block having a third and a fourth PMOS transistors and a third and a fourth NMOS transistor which are serially connected between a supply voltage and a ground voltage, gates of the third PMOS transistor and the fourth NMOS transistor being coupled to a output signal of the data select block and gate of the fourth PMOS transistor being coupled to a falling edge output signal and gate of the third NMOS transistor being coupled to the inversed falling edge output signal,
   wherein the fourth logical signal is used for arranging an even number times data in response to the start address and the falling edge output signal is used for outputting the output signal of the second data select block at a falling edge of the first and the second clock pulse.

10. A semiconductor memory device for prefetching 4-bit data from at least one bank in response to an instruction for reading data, comprising:
   a first control signal generating means for generating a first and a second control signals generated by logically combining a data input control signal with a data output control signal;
   a second control signal generating means for generating a third control signal and a fourth control signal, the third control signal generated by logically combining an odd enable signal which is used for outputting an odd times data with an odd arranging signal which is used for arranging the odd times data in response to a start address of the 4-bit data, the fourth controls signal generated by logically combining an even enable signal which is used for outputting an even times data with a even arranging signal which is used for arranging the even times data in response to a start address of the 4-bit data; and
   a signal delivering means controlled by the first, the second and the third control signals for outputting the 4-bit data to a first and a second even data output lines and a first and a second odd data output lines.

11. The semiconductor memory device of claim 10, wherein the first control signal generating means includes:
   an inverter receiving the data input control signal;

a first NAND gate for receiving the data output signal and an output of the inverter and generating the first control signal; and a second NAND gate for receiving the output of the inverter and an output of the first NAND gate and generating the second control signal.

12. The semiconductor memory device of claim 11, wherein the second control signal generating means includes:

an odd data control block for generating the third control signal by logically combining the odd enable signal with the odd arranging signal; and an even data control block for generating the fourth control signal by logically combining the even enable signal with the even arranging signal.

13. The semiconductor memory device of claim 12, wherein the odd data control block includes:

an inverter receiving the odd enable signal;

a first NAND gate for receiving the odd arranging signal and an output of the inverter and generating a prior third control signal; and a second NAND gate for receiving the output of the inverter and an output of the first NAND gate and generating a later third control signal.

14. The semiconductor memory device of claim 13, wherein the even data control block includes:

an inverter receiving the even enable signal;

a first NAND gate for receiving the even arranging signal and an output of the inverter and generating prior the fourth control signal; and a second NAND gate for receiving the output of the inverter and an output of the first NAND gate and generating later the fourth control signal.

15. The semiconductor memory device of claim 14, wherein the signal delivering means includes:

a first data arranging unit controlled by the first control signal for arranging the inputted data;

a latch unit for temporary storing data outputted from the first data arranging unit; and a second data arranging unit for arranging and outputting the stored data in the latch unit.

16. The semiconductor memory device of claim 15, wherein the first data arranging unit includes:

a first passgate for outputting a first data by the first control signal;

a second passgate for outputting a second data by the second control signal;

a third passgate for outputting a third data by the first control signal; and a fourth second passgate for outputting a fourth data by the second control signal.

17. The semiconductor memory device of claim 16, wherein the latch unit includes two inverters connected to each other for forming a loop with can latch a data.

18. The semiconductor memory device of claim 17, wherein the second data arranging unit outputs an inputted data in response to the prior or later third control signals.

* * * * *